United States Patent
Asamura

(10) Patent No.: US 9,041,476 B2
(45) Date of Patent: May 26, 2015

(54) CRYSTAL CONTROLLED OSCILLATOR

(71) Applicant: NIHON DEMPA KOGYO CO., LTD., Tokyo (JP)

(72) Inventor: Fumio Asamura, Saitama (JP)

(73) Assignee: NIHON DEMPA KOGYO CO., LTD., Tokyo (JP)

( * ) Notice: Subject to any disclaimer, the term of this patent is extended or adjusted under 35 U.S.C. 154(b) by 133 days.

(21) Appl. No.: 13/831,996

(22) Filed: Mar. 15, 2013

(65) Prior Publication Data

US 2013/0257549 A1    Oct. 3, 2013

(30) Foreign Application Priority Data

Mar. 29, 2012 (JP) ................. 2012-076925

(51) Int. Cl.
   *H03B 5/36* (2006.01)
   *H03H 9/05* (2006.01)
   *H03H 9/02* (2006.01)

(52) U.S. Cl.
   CPC .......... *H03H 9/0538* (2013.01); *H03H 9/02086* (2013.01); *H03H 9/0542* (2013.01); *H03H 9/0547* (2013.01); *H01L 2224/16225* (2013.01); *H01L 2924/0002* (2013.01)

(58) Field of Classification Search
   CPC .................................................. H03H 9/0538
   USPC .................... 331/67, 68, 116 R, 154, 158
   See application file for complete search history.

(56) References Cited

U.S. PATENT DOCUMENTS

| 5,382,929 | A  | * | 1/1995 | Inao et al. ............... 333/187 |
| 2002/0135429 | A1 | * | 9/2002 | Akagawa et al. ........... 331/68 |
| 2005/0040905 | A1 | * | 2/2005 | Hatanaka et al. .......... 331/176 |

FOREIGN PATENT DOCUMENTS

| JP | 2001-244744 | 9/2001 |
| JP | 2007-142947 | 6/2007 |
| JP | 2009-152715 | 7/2009 |
| JP | 2010-153941 | 7/2010 |
| JP | 4591330 | 12/2010 |

* cited by examiner

*Primary Examiner* — Joseph Chang
*Assistant Examiner* — Jeffrey Shin
(74) *Attorney, Agent, or Firm* — Jianq Chyun IP Office

(57) ABSTRACT

A crystal controlled oscillator includes a crystal package and an IC chip board that includes an IC chip integrating an oscillator circuit. The crystal package includes a first container, a crystal resonator, a lid body, and an external terminal at an outer bottom surface of the first bottom wall layer of the first container. The IC chip integrates an oscillator circuit disposed at an outer bottom surface of the first bottom wall layer of the crystal package. The oscillator circuit connects to the lower side excitation electrode of the crystal resonator from the external terminal to an input side with high impedance. The oscillator circuit connects to the upper side excitation electrode to an output side with low impedance. The upper side excitation electrode is a shielding electrode of the crystal resonator.

9 Claims, 11 Drawing Sheets

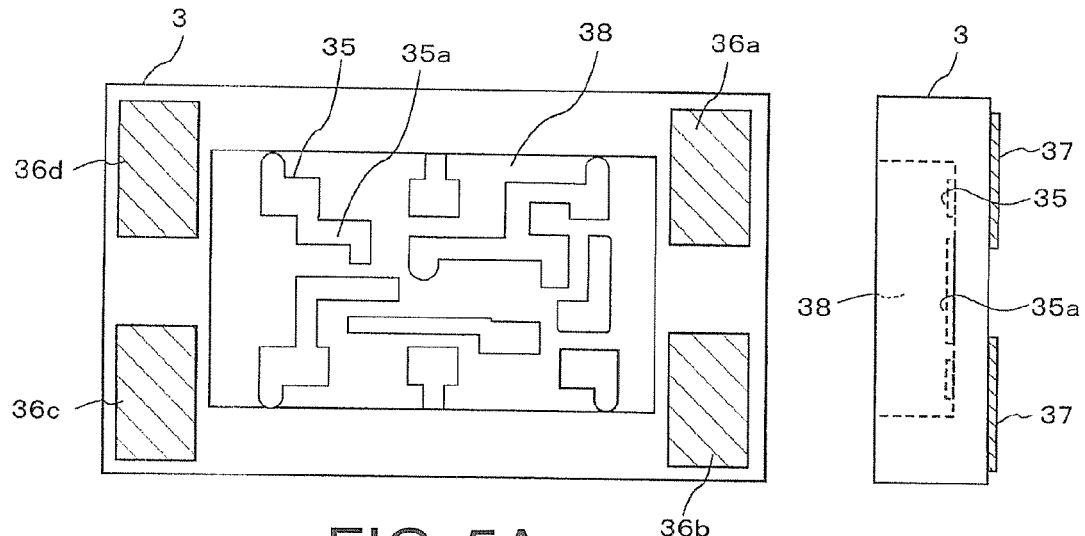
FIG. 5A
FIG. 5C
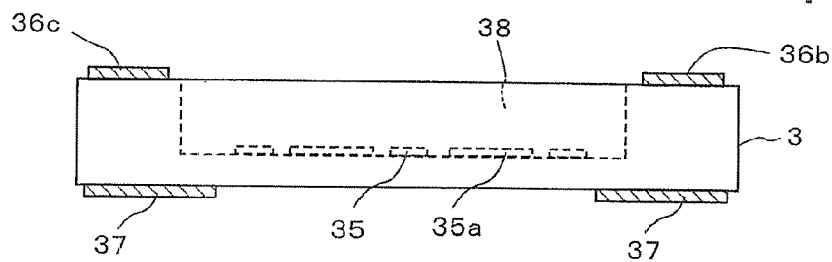
FIG. 5B
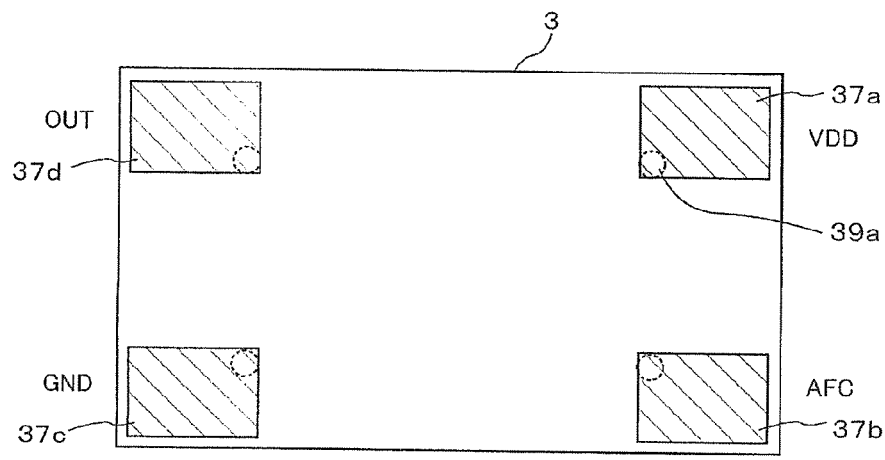
FIG. 6

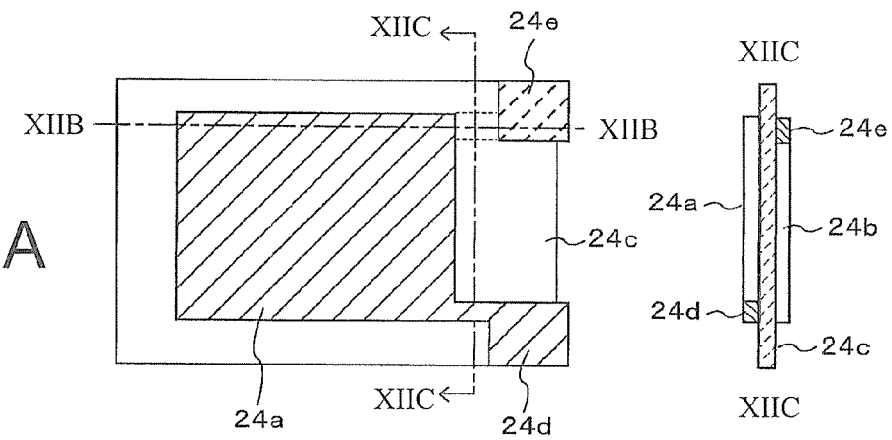
FIG. 7A
FIG. 7C
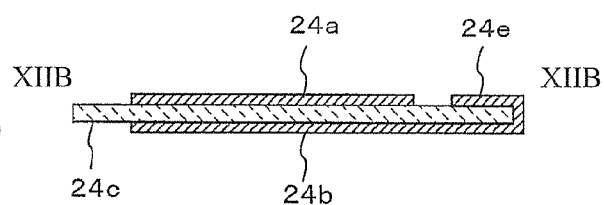
FIG. 7B
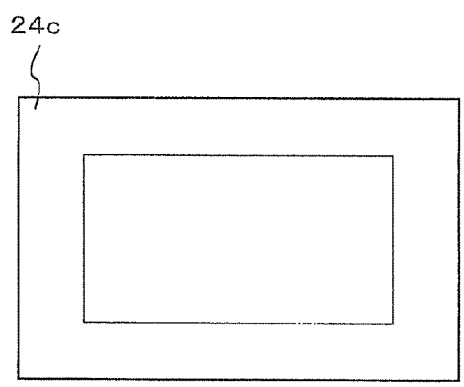
FIG. 8A
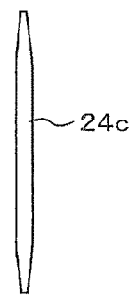
FIG. 8C
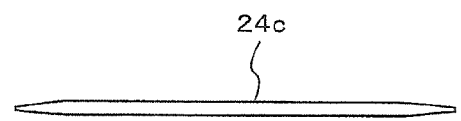
FIG. 8B

CRYSTAL CONTROLLED OSCILLATOR

CROSS REFERENCE TO RELATED APPLICATIONS

This application claims the priority benefit of Japan application serial no. 2012-076925, filed on Mar. 29, 2012. The entirety of the above-mentioned patent application is hereby incorporated by reference herein and made a part of this specification.

TECHNICAL FIELD

This disclosure relates to a crystal controlled oscillator. Especially, this disclosure relates to a surface mount crystal controlled oscillator that integrates a crystal package and an IC chip. The crystal package houses a crystal resonator in a container made of a crystal, glass, or similar material. The IC chip is an electronic circuit part that constitutes an oscillator together with the crystal resonator.

DESCRIPTION OF THE RELATED ART

A surface mount crystal controlled oscillator (hereinafter simply referred to as a crystal controlled oscillator) is small in size and lightweight. For example, a temperature compensation type crystal controlled oscillator has a high frequency stability with respect to a change in external air temperature. The crystal controlled oscillator is embedded especially in portable electronic equipment (such as a mobile phone) as a frequency reference source or a time reference source.

FIG. 12 is a schematic view illustrating one exemplary constitution of a conventional crystal controlled oscillator. A crystal controlled oscillator 1 includes a crystal package 2 and an IC chip board 3. The crystal package 2 houses a crystal resonator 24 and is an approximately rectangular in planar view. The IC chip board 3 is a circuit component and has approximately the same size as the crystal package 2 in planar view and includes an IC chip 33 that integrates an electronic circuit constituting a crystal controlled oscillator 1 together with the crystal package 2. In this constitution, the IC chip board 3 includes the IC chip 33 mounted to a depressed portion in a container made of an insulating material preferably to be a ceramics sheet (which is also referred to as a green sheet).

The crystal package 2 includes a container main body 20, which is rectangular in planar view, made of an insulating material preferably to be a ceramics sheet similar to the IC chip board 3. The container main body 20 is formed by a bottom wall layer of the crystal package (hereinafter referred to as a first bottom wall layer) 21 and a frame wall layer of the crystal package (hereinafter referred to as a first frame wall layer) 22. A crystal resonator 24 is housed in a depressed portion (a depressed portion of the crystal package, hereinafter referred to as a first depressed portion) 28 surrounded by the first frame wall layer 22 of the container main body 20. Usually, the crystal package 2 and the IC chip board 3 share an outer side surface in a state where the crystal package 2 and the IC chip board 3 are stacked in the vertical direction and are bonded as the crystal controlled oscillator 1.

The crystal resonator 24 includes excitation electrodes 24a (the opposite side of the IC chip 33, hereinafter referred to as an upper side excitation electrode) and 24b (the side facing the IC chip 33, hereinafter referred to as a lower side excitation electrode) on both upper and lower surfaces of a thin piece of crystal (a crystal piece, a crystal blank) 24c. Extraction electrodes (not shown) extending from these excitation electrodes to one end edge of the crystal piece 24c are fixedly secured to a pair of crystal olding terminals 26 (only one side is shown) with a conductive adhesive 8. The pair of crystal holding terminals 26 is disposed on an inner bottom surface (one principal surface) of the first depressed portion 28.

The first depressed portion 28 that houses the crystal resonator 24 is usually hermetically sealed by a lid body 23 of a metal plate to form the crystal package 2. The lid body 23 is preferably to be an iron alloy called kovar. The lid body 23 and the first frame wall layer 22 are hermetically sealed via a metal film (such as a tungsten metallized film, a nickel plating layer, and a gold plating layer) by a method such as seam welding. The first bottom wall layer 21 has an outer bottom surface (the other principal surface) where an external terminal 27 is disposed. The external terminal 27 connects to a connecting terminal 36 of the IC chip board 3 mounted with the IC chip 33 via a solder layer 6. The external terminal 27 electrically connects to a wiring pattern 29 that connects to the crystal holding terminal 26 with a through hole or a via hole 29a that passes through the first bottom wall layer 21.

The IC chip board 3 mounted with the IC chip 33 is constituted by a laminated substrate of a bottom wall layer of the IC chip board (hereinafter referred to as a second bottom wall layer) 31 and a frame wall layer of the IC chip board (hereinafter referred to as a second frame wall layer) 32, which are made of an insulating material preferably to be a ceramics sheet. The IC chip board 3 may employ a multilayer in the second bottom wall layer and the second frame wall layer. The IC chip board 3 includes one principal surface (an IC chip mounting surface), which is an inner bottom surface of a depressed portion (hereinafter referred to as a second depressed portion) 38 of the IC chip board 3 surrounded by the second frame wall layer 32 of the IC chip board 3. A wiring pattern and a plurality of electrode pads 35 are formed on the one principal surface. The connecting terminals 36 are formed on the opening end surface of the second frame wall layer 32. The connecting terminal 36 is to be connected to the external terminal 27 of the crystal package 2. The IC chip board 3 has the other principal surface (the outer bottom surface of the second bottom wall layer 31, equipment mounting surface) where a plurality of mounting terminals 37 (four in this example) is disposed for applying to the surface mounting of a circuit board of the electronic equipment.

The IC chip 33 is fixedly secured to the electrode pad 35 on one principal surface (an inner bottom surface) of the second frame wall layer 32 via its mounting bump (such as a solder bump or gold bump) 34 by ultrasonic thermo-compression bonding or similar method. Further, resin, which is preferably an epoxy resin, referred to as an underfill is filled between the IC chip 33 and the one principal surface of the IC chip board 3, thus strength is improved as a device. The mounting of the IC chip is not limited to a connection using a bump and an electrode pad. A wire (so-called wire bonding) may also be employed.

The IC chip board 3 with the IC chip 33 and the crystal package 2 are generally bonded together as follows. A solder material is disposed between the connecting terminal 36, which is formed on the opening end surface (the surface facing the outer bottom surface of the crystal package) of the second frame wall layer 32 of the IC chip board 3, and the external terminal 27 of the crystal package 2. The solder material is melted by a reflow process and then hardens, thus a solder layer 6 is formed and both are bonded together. The solder layer 6 is formed only on the top surface of the connecting terminal 36 made of a metal material. The solder layer 6 may be disposed on the external terminal 27 of the crystal package 2 for the reflow process. Further, Japanese Patent No.

4591330 discloses bonding of the IC chip board 3 with the IC chip 33 and the crystal package 2 employing thermoset resin where solder particles are dispersed.

FIG. 13 is a circuit diagram of a typical voltage controlled crystal oscillator circuit. Since the illustrated circuit is well known, a detailed explanation is omitted. The crystal resonator 24 is connected in parallel with an inverter (an inverting amplifier) 5. That is, the excitation electrodes 24a and 24b disposed on the front and back of the crystal piece 24c are connected to input and output terminals of the inverting amplifier (the inverter) 5. The output terminal of the inverter 5 is connected to an output buffer circuit 46 (described below in FIG. 14), and is output to the output terminal of the crystal controlled oscillator (the mounting terminal). Varicaps VD1 and VD2 are connected to the crystal resonator 24 and constitute a load capacitance together with capacitances C1 and C2. An oscillation frequency control voltage is applied from a terminal V0 to the varicaps VD1 and VD2 via high frequency blocking resistors R2 and R3 to control an oscillation frequency to a predetermined value. Japanese Unexamined Patent Application Publications No. 2001-244744 discloses the related art related to this type of crystal oscillator circuit.

FIG. 14 is a functional block diagram illustrating an exemplary system configuration of a temperature compensation type crystal controlled oscillator. The crystal resonator 24 and the IC chip 33 correspond to the same reference numerals illustrated in FIG. 13. A circuit part of the oscillator circuit other than the crystal resonator 24 of this crystal controlled oscillator is integrated to the IC chip 33. As the main terminals of the IC chip 33, a supply voltage (VDD) input terminal T1, an automatic frequency control voltage (AFC) input terminal T2, an oscillation output (OUT) terminal T3, and a grounding (GND) terminal T4 are disposed.

The crystal resonator 24 is connected outside of a voltage controlled crystal oscillator circuit 40 integrated to the IC chip 33. In addition to a vibration output of the crystal resonator 24, an output of an automatic frequency control input adjustment circuit 41 and an output of a temperature compensation circuit 44 are connected to an input side of the voltage controlled crystal oscillator circuit 40. In addition to a vibration input of the crystal resonator 24, the output buffer circuit 46 is connected to an output of the voltage controlled crystal oscillator circuit 40.

The automatic frequency control input adjustment circuit 41 controls an oscillation frequency of the voltage controlled crystal oscillator circuit 40 based on an automatic frequency control voltage AFC input from outside to a terminal T2. The temperature compensation circuit 44 suppresses a variation of a vibration frequency of the crystal resonator caused by temperature change. The variation is suppressed by inputting a voltage obtained by operating a temperature detection signal of a temperature sensor circuit 43 including a temperature sensor such as a diode and a temperature compensation coefficient stored in a non-volatile memory 42 to a control input unit of the voltage controlled crystal oscillator circuit 40.

The output buffer circuit 46 receives an oscillation output of the voltage controlled crystal oscillator circuit 40. The output buffer circuit 46 is driven by a predetermined constant voltage generated in a constant voltage circuit 45 based on a supply voltage (VDD) applied to a terminal T1. Then, the signal is supplied to the output terminal T3 as a signal at a level conforms to the latter oscillation signal utilization circuit. The constant voltage circuit 45 supplies a required voltage for another circuit.

Besides, Japanese Unexamined Patent Application Publications No. 2007-142947, Japanese Unexamined Patent Application Publications No. 2009-152715, Japanese Unexamined Patent Application Publications No. 2010-153941, or similar disclose the related arts related to this type of crystal controlled oscillator.

A structure of a crystal controlled oscillator where a crystal unit and an IC chip are integrated is roughly divided into the following constitutions. As described above, the current crystal package houses a crystal resonator in a container made of an insulating material preferably to be a ceramics sheet and hermetically seals an opening with a lid body made of metal. The crystal package includes an external connecting terminal (hereinafter simply referred to as an external terminal) on its outer bottom surface.

An IC chip is mounted at the outer bottom surface of such crystal package and is housed in a container with an opening where a depressed portion is formed by an insulating material similarly preferable to be a ceramics sheet. Then, resin is filled in the depressed portion housing the IC chip, thus an IC chip board is constituted. Further, a connecting terminal disposed at the opening end surface is bonded to an external terminal of the crystal package with a solder layer. Thus, both are integrated to form a crystal controlled oscillator.

The IC chip is mounted on a substrate made of an insulating material preferably to be a ceramics sheet. Metal balls such as solder balls are integrally and fixedly secured to the outer bottom surface of the crystal package and provide an electrical connecting means for the external terminals of the crystal package and a spacer from the crystal package.

A depressed portion is disposed at the outer bottom surface of the crystal package, the IC chip is mounted in the depressed portion, and resin is poured into a gap between the IC chip and the crystal package to dispose a so-called underfill layer. Alternatively, in addition to the underfill layer, resin is filled to the depressed portion covering the entire IC chip to mold the entire IC chip for integration.

The structure of the crystal controlled oscillator is not limited to the above-described structure where a preliminary and separately fabricated crystal package and IC chip board are bonded together for integration. For example, the following structures are known. A depressed portion for mounting an additional IC chip is disposed at a part of a container of the crystal package, and a depressed portion housing both is sealed by a common lid body made of metal material. Alternatively, the crystal resonator, the IC chip, and other electronic components are arranged on a common substrate, or additional substrate is further stacked in multiple substrates and covers the IC chip with a cap-like lid body made of metal.

To mechanically bond the crystal package sealed by the lid body made of metal and the IC chip together as a preliminarily fabricated package as described above, if these terminals (the external terminal and the connecting terminal) are solder-bonded to each other, the crystal package and the IC chip are integrated by bonding of these terminals. A gap may remain in a part other than the bonding part. Dust enters from the gap, or an outside atmosphere directly acts on the IC chip. To protect the IC chip from dust, a vibration, or similar cause, the related art employs the above-described underfill and resin mold.

Additionally, for bonding using solder, a solder film is required to be preliminary precoated on a surface of the connecting terminal. This structure requires a process of application of a solder film before a reflow process. Furthermore, there may be a case where a solder resist is required to be applied to a part other than a solder connection part. Accordingly, a fabrication as the crystal controlled oscillator requires many processes, which is one cause obstructing cost reduction.

Further, in any above-described structure, the crystal package which houses the crystal resonator employs a welded lid body of a metal plate to electromagnetically-shield and to seal the container which forms the depressed portion with a ceramics sheet. The lid body made of metal is connected to the ground, the crystal resonator is shielded from an external magnetic field, and influence of external noise is reduced.

As an insulating material of a package constituting this type of crystal controlled oscillator, as described above, a ceramics sheet (which is also referred to as a green sheet) is generally employed. However, a crystal controlled oscillator has been recently downsized, especially, similar to a crystal controlled oscillator with high functionality, such as a temperature control type crystal controlled oscillator, is requested to be downsized and reduced in cost. The crystal resonators employed for these crystal controlled oscillators have also been downsized. According to the downsizing, precisely processing a ceramics sheet becomes further difficult, and reduction in material cost is limited.

For cost reduction, as a constituent material of the crystal package, a non-metal material other than a ceramics sheet, which is low-price and easily processed, (for example, an insulating material such as a glass material) may be employed. However, for example, if the crystal package is formed only by a glass material including the lid body, either of the following configurations is required. A metal plate is attached at least either of the front and back of the lid body of the glass material. Alternatively, a metal film is formed and grounded for electromagnetic shielding of the crystal resonator against outside atmosphere. Providing this electromagnetic shielding structure significantly diminishes both cost reduction and the effect of reduction of fabrication processes. Additionally, as a non-metal material employed for the container of the crystal package, employing a quartz-crystal material as well as a glass material may be considered. In this case as well, similar to a glass material, shielding instead of a metal lid body is required to be provided.

A need thus exists for a crystal controlled oscillator which is not susceptible to the drawback mentioned above.

Note that this disclosure is not limited to a crystal controlled oscillator but is also applicable to a piezoelectric oscillator that employs a piezoelectric material including a crystal or a general bonding structure of an electronic component where a piezoelectric material is a required constituent. However, in this disclosure including embodiments, a crystal controlled oscillator is described as a typical example.

SUMMARY

A crystal controlled oscillator includes a crystal package with an insulating container that houses a crystal resonator and an IC chip board that includes an IC chip integrating an oscillator circuit. The oscillator circuit is configured to generate an oscillation signal of a predetermined frequency based on a vibration signal of the crystal resonator. The crystal package includes a first container, a crystal resonator, a lid body, and an external terminal at an outer bottom surface of the first bottom wall layer of the first container. The first container includes a planar first bottom wall layer made of an insulating material and a first frame wall layer disposed at an end edge of the first bottom wall layer. The first frame wall layer forms a first depressed portion. The crystal resonator is housed in the first depressed portion along an inner surface of the first bottom wall layer. The lid body is secured to the first frame wall layer so as to hermetically seal the first depressed portion. The lid body is made of an insulating material only. The external terminal is configured to output a vibration signal of the crystal resonator. The crystal resonator includes a crystal piece, an upper side excitation electrode on an upper surface of the crystal piece, and a lower side excitation electrode on a lower surface of the crystal piece. The IC chip integrates an oscillator circuit disposed at an outer bottom surface of the first bottom wall layer of the crystal package. The oscillator circuit connects to the lower side excitation electrode of the crystal resonator from the external terminal to an input side with high impedance. The oscillator circuit connects to the upper side excitation electrode to an output side with low impedance. The upper side excitation electrode is a shielding electrode of the crystal resonator.

BRIEF DESCRIPTION OF THE DRAWINGS

The foregoing and additional features and characteristics of this disclosure will become more apparent from the following detailed description considered with the reference to the accompanying drawings, wherein:

FIG. 5A to FIG. 5C are schematic views further illustrating the constitution of the IC chip board illustrated in FIG. 4B;

FIG. 6 is an outer bottom view of the IC chip board illustrated in FIG. 5A to FIG. 5C;

FIG. 7A to FIG. 7C are schematic views illustrating one constitution of a crystal resonator 24 housed in the crystal package according to the crystal controlled oscillator of the disclosure;

FIG. 8A to FIG. 8C are trihedral views illustrating a crystal piece of another shape employed for the crystal resonator of the crystal controlled oscillator according to the disclosure;

DETAILED DESCRIPTION

Embodiments disclosed here will be explained in detail. The following embodiment describes with a structure employing a crystal plate among insulating materials such as a glass as a material constituting a crystal package. The subsequent embodiments describe a structure employing a glass plate. As a material constituting an IC chip board, a ceramics

Embodiment 1

Figure 1A:
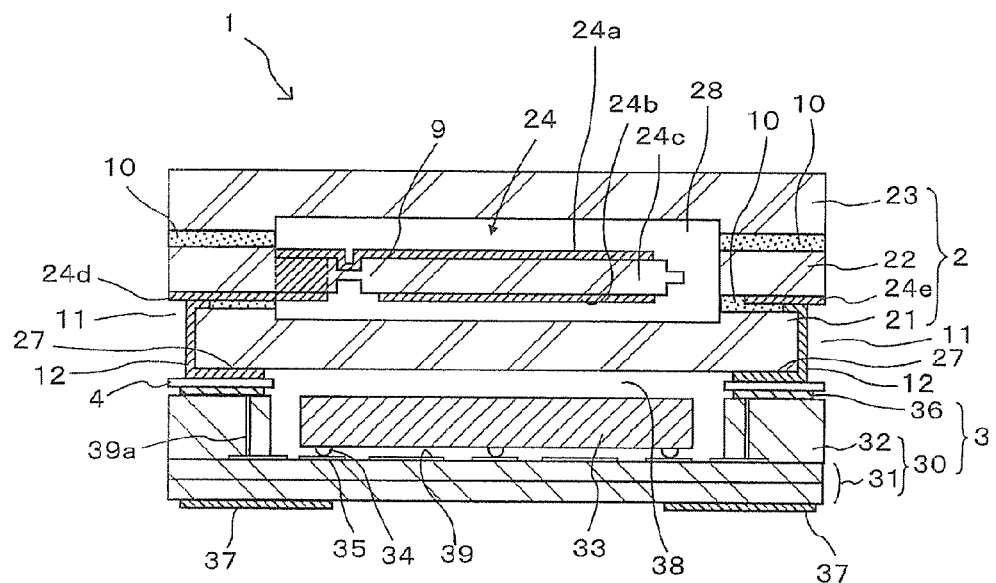
FIG. 1A and FIG. 1B are schematic views illustrating a crystal controlled oscillator according to Embodiment 1 of the disclosure.
Figure 1B:
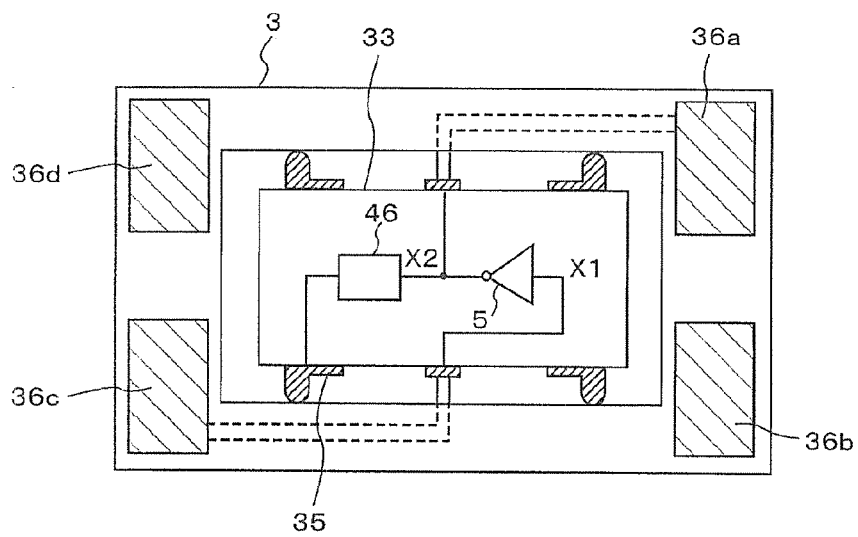

FIG. 1A and FIG. 1B are explanatory views of a crystal controlled oscillator according to Embodiment 1 of the disclosure. FIG. 1A illustrates a cross-sectional view. FIG. 1B illustrates a plan view of the IC chip board of FIG. 1A viewed from a crystal package side. A crystal controlled oscillator 1 according to Embodiment 1 includes a crystal package 2 and an IC chip board 3. The crystal package 2 of Embodiment 1 includes a crystal piece 24c, an upper side excitation electrode 24a, a lower side excitation electrode 24b, and extraction electrodes 24d and 24e. The crystal piece 24c is formed by etching of a crystal plate. The extraction electrodes 24d and 24e take vibration signals from these electrodes.

The crystal package 2 is formed by sandwiching a frame wall layer (a first frame wall layer) 22 by a bottom wall layer (a first bottom wall layer) 21 and a lid body 23. The first frame wall layer 22 includes a crystal piece 24c, which is supported by a connecting portion 9 from inside of a framing portion formed by a rectangular crystal plate in a plan view. The first bottom wall layer 21 is similarly made of a crystal plate. This structure forms a space (a first depressed portion) 28 to house the crystal resonator 24. The first frame wall layer 22, the first bottom wall layer 21, and the lid body 23 are sealed with a sealing material (such as a low-melting point glass) 10 and fixedly secured. Details will be described below.

Extraction electrodes 24d and 24e are extracted to the bottom surface of the first frame wall layer 22 (the surface facing the IC chip board) via a castellation electrode 12, which will be described below, and become external terminals 27. Then, the external terminal 27 is fixedly secured to a connecting terminal 36 of the IC chip board 3 with thermoset resin with solder particles 4. The external terminal 27 and the connecting terminal 36 are fixedly secured by metal bonding with solder particles engaged in both terminals.

The IC chip board 3 mounted with the IC chip 33 employs a laminated substrate formed of a bottom wall layer (a second bottom wall layer) 31 of the IC chip board 3 and a frame wall layer (a second frame wall layer) 32 of the IC chip board 3 made of a ceramics sheet. A multilayer sheet may form one or the other of the second bottom wall layer 31 and the second frame wall layer 32, which constitute the IC chip board 3. The second bottom wall layer 31 and the second frame wall layer 32 may also be made of a crystal plate similar to the crystal package or a glass plate.

The IC chip board 3 includes one principal surface (an IC chip mounting surface), which is the inner bottom surface of a depressed portion (a second depressed portion) 38 of the IC chip board 3 surrounded by the second frame wall layer 32 of the IC chip board 3. A wiring pattern and a plurality of electrode pads 35 are formed on the one principal surface. The connecting terminal 36 to be connected to the external terminal 27 of the crystal package 2 are formed on the opening end surface of the second frame wall layer 32. The IC chip board 3 includes the other principal surface (the outer bottom surface of the second bottom wall layer 31, target equipment mounting surface) where a plurality of mounting terminals 37 (four in this example) are disposed for surface mounting to apply on a circuit board of the electronic equipment.

The IC chip 33 is fixedly secured to the electrode pad 35 on one principal surface (the inner bottom surface) of the second frame wall layer 32 via its mounting bump 34 (such as a solder bump or a gold bump) by ultrasonic thermo-compression bonding or similar method. FIG. 1B is a plan view when the IC chip board 3 is viewed from the side of the crystal package 2. The IC chip 33 is mounted in the second depressed portion 38.

Figure 13:
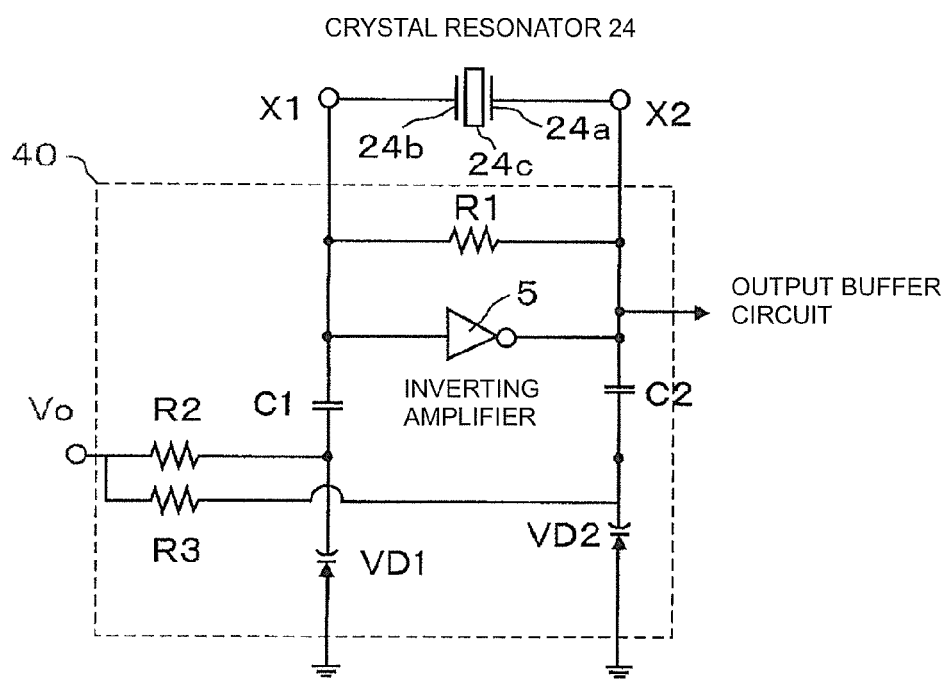
FIG. 13 is a circuit view of a typical crystal oscillator circuit.
Figure 14:
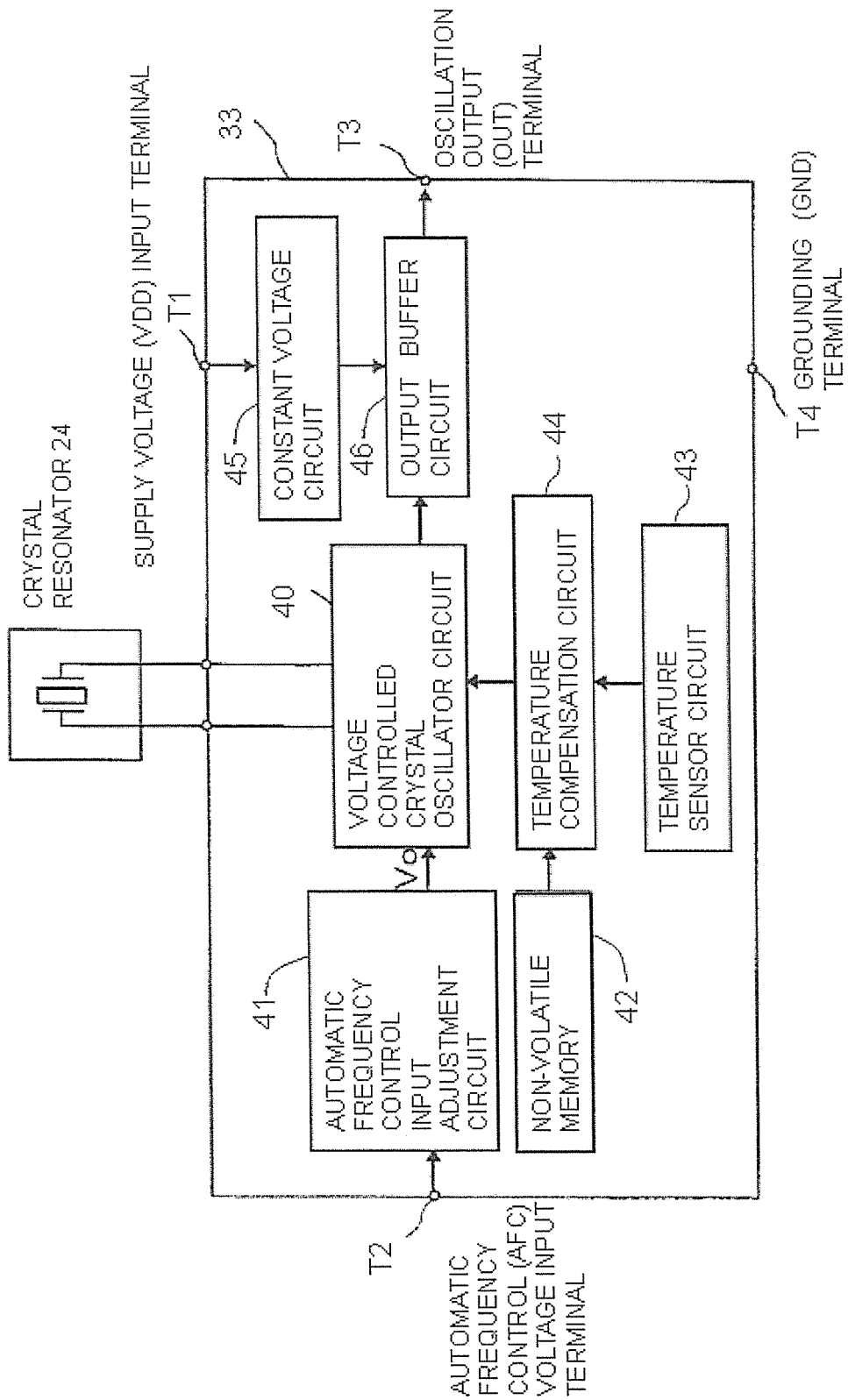
FIG. 14 is a functional block diagram illustrating an exemplary system configuration of a temperature compensation type crystal controlled oscillator.

FIG. 1B schematically illustrates the main part of the crystal oscillator circuit in the IC chip 33 especially related to this disclosure. That is, among oscillator circuits illustrated in the above-described FIG. 13 and FIG. 14, an inverting amplifier 5 and an output buffer circuit 46 are selected for the illustration.

A second container is formed by the second bottom wall layer 31 and the second frame wall layer 32 that constitute the IC chip board 3. In the second container, the connecting terminals 36 (36a, 36b, 36c, 36d) are disposed on the opening end surface (the surface of the second frame wall layer 32 facing the external terminal 27 of the crystal package 2) of the second depressed portion 38. The connecting terminal 36 faces and electrically connects to the external terminal 27 of the crystal package 2. The connecting terminals 36 (36a, 36b, 36c, 36d) connects to a predetermined circuit terminal of the IC chip 33 via a through hole or a via hole, which is appropriately disposed at the second container, and a wiring (not shown), which is patterned on the inner bottom surface of the second bottom wall layer 31 that constitutes the second depressed portion 38.

Among the connecting terminals 36 (36a, 36b, 36c, and 36d), the connecting terminal 36a connects to an upper side excitation electrode 24a (the opposite side of the IC chip 33) of the crystal resonator 24 while the connecting terminal 36c connects to a lower side excitation electrode 24b (the side facing the IC chip 33) of the crystal resonator 24.

Vibration signals of the crystal resonator 24 of the crystal package 2 are connected to an input side (X1) and an output side (X2) of an oscillator circuit integrated to the IC chip 33 mounted to the IC chip board 3 through the external terminal 27, the castellation electrode 12, and the connecting terminal 36. At this time, the excitation electrode (the upper side excitation electrode) 24a positioned at the upper side of the crystal resonator (the opposite side of the IC chip) is connected to an output side (X2), which has a low impedance. The lower side excitation electrode 24b is connected to an input side (X1), which is a high impedance side.

This enables the upper side excitation electrode 24a to serve as electromagnetic shielding of the crystal resonator 24. An electric charge generated by an external magnetic field, which acts on the upper side excitation electrode, is grounded from an output terminal of the oscillator circuit that is a low impedance side of the oscillator circuit. This reduces the generated voltage level minute. This can prevent the accumulation of an electric charge that remains in the crystal resonator and affects the vibration signal.

Figure 2A:
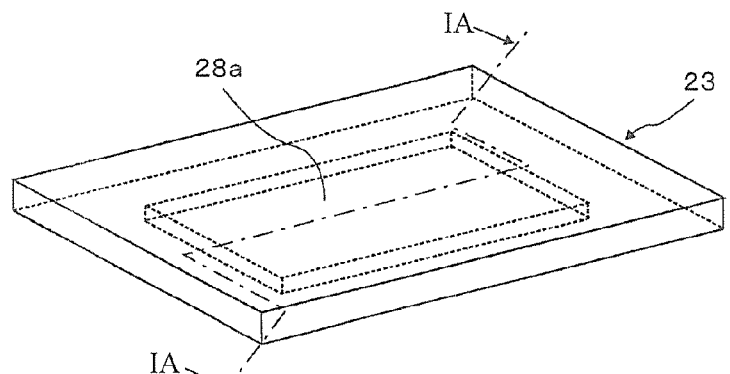
FIG. 2A to FIG. 2C are expanded schematic views illustrating the constitution of a crystal package employed for Embodiment 1 of the crystal controlled oscillator according to the disclosure.
Figure 2B:
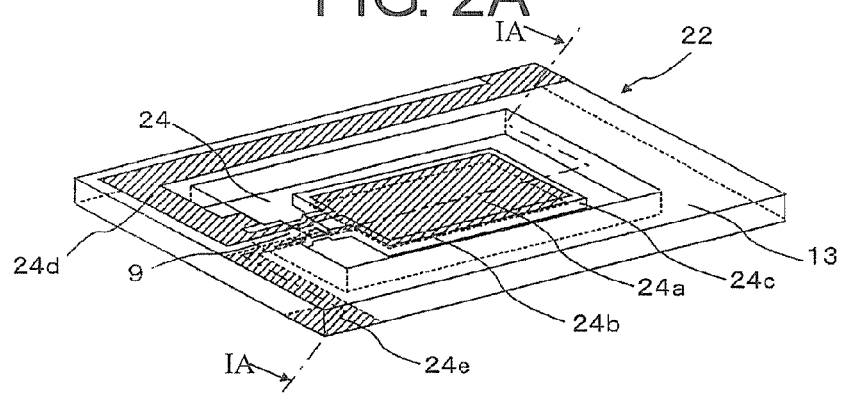
Figure 2C:
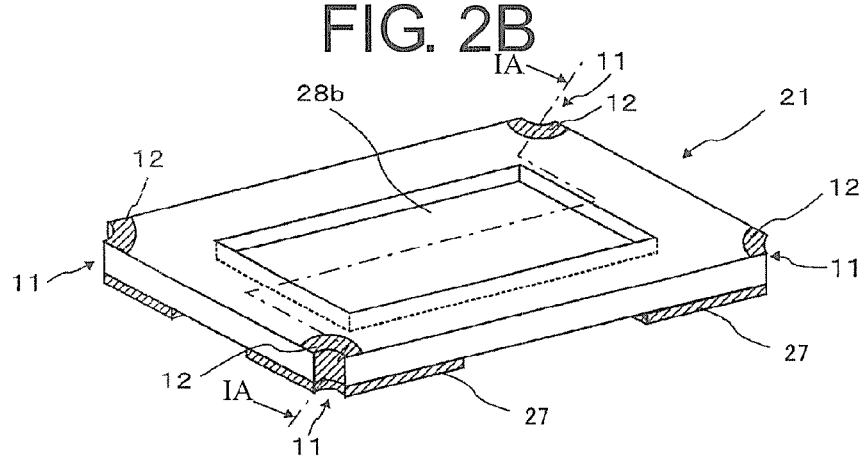

FIG. 2A to FIG. 2C are expanded schematic views illustrating the constitution of the crystal package employed for Embodiment 1 of the crystal controlled oscillator according to the disclosure. The cross section along the line IA-IA illustrated in FIG. 2A to FIG. 2C corresponds to FIG. 1A. The crystal package 2 includes the crystal piece 24c, the upper side excitation electrode 24a, the lower side excitation electrode 24b, and the extraction electrodes 24d and 24e. The crystal piece 24c is formed by etching of a crystal plate. The extraction electrodes 24d and 24e take vibration signals from these electrodes.

The crystal package illustrated in FIG. 2A to FIG. 2C is formed by sandwiching the frame wall layer (the first frame wall layer) 22 by the bottom wall layer (the first bottom wall layer) 21 and the lid body 23. The first frame wall layer 22 includes the crystal piece 24c, which is supported by the connecting portion 9 from inside of a framing portion 13 formed by a rectangular crystal plate in a plan view. The first bottom wall layer 21 is similarly made of a crystal plate. Thus, the package is formed. The crystal resonator 24 is housed in the first depressed portion 28. The first frame wall layer 22, the first bottom wall layer 21, and the lid body 23 are sealed by a sealing material 10 and fixedly secured. The crystal resonator 24 includes the excitation electrodes 24a (the upper side excitation electrode) and 24b (the lower side excitation electrode) on the front and back of the crystal piece 24c connected to the framing portion 13 with the connecting portion 9. The extraction electrodes 24d and 24e are extracted from the respective excitation electrodes to the upper side surface and the lower side surface. The extraction electrode 24d at the upper side is connected to the castellation electrode 12 of the first bottom wall layer 21 via an inner wall surface, a through hole, or a via hole (not shown).

In this embodiment, a castellation 11 is disposed only at the first bottom wall layer 21. The castellation 11 may be disposed at the first frame wall layer 22 or may be disposed at the first frame wall layer 22 and the lid body 23. This enables the extraction electrodes 24d and 24e to be connected to the external terminals 27 without using the above-described inner wall surface, through hole, or via hole.

As illustrated, a lower side depressed portion 28b is formed at the first frame wall layer 22 side of the first bottom wall layer 21. An upper side depressed portion 28a is formed at the first frame wall layer 22 side of the lid body 23. Bonding these first bottom wall layer 21 and lid body 23 to the first frame wall layer 22 forms the first depressed portion 28 that houses the crystal resonator 24.

Figure 3:
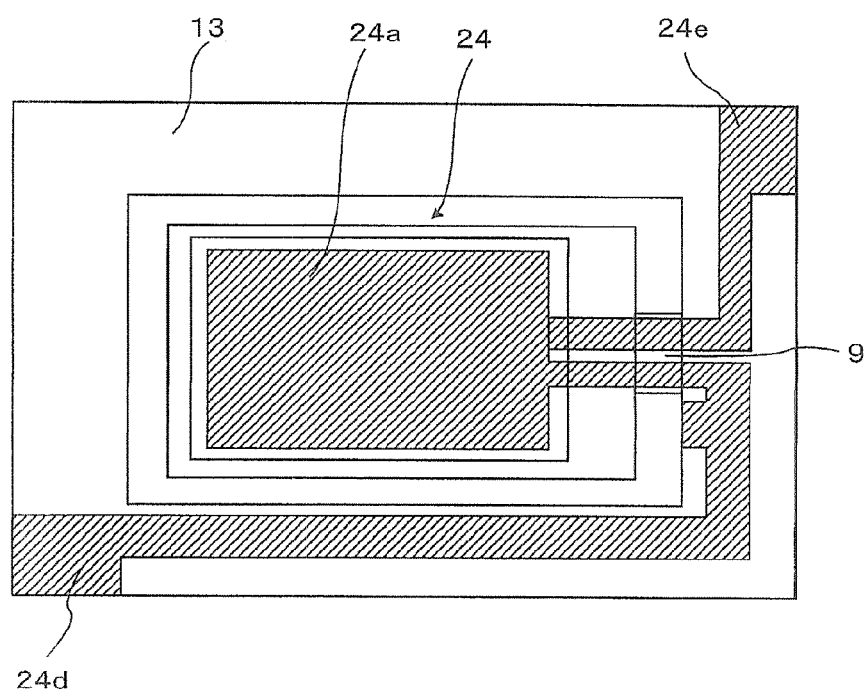
FIG. 3 is a schematic plan view illustrating the constitution of a first frame wall layer constituting the crystal package employed for Embodiment 1 of the crystal controlled oscillator according to the disclosure.

FIG. 3 is a schematic plan view illustrating the constitution of the first frame wall layer constituting the crystal package employed for Embodiment 1 of the crystal controlled oscillator according to the disclosure. This first frame wall layer 22 is formed by etching of a crystal plate. The crystal piece 24c is held inside of the framing portion 13 with the connecting portion 9. As illustrated in FIG. 1A, the crystal piece is etched to be thin such that the thickness of the crystal piece is applicable to a predetermined vibration characteristic. Additionally, the thickness of the connecting portion 9 is formed to be thin, while considering the vibration characteristic of the crystal piece, and mechanically and securely supporting the crystal piece.

The upper side excitation electrode 24a and the lower side excitation electrode 24b are formed on the front and back of the crystal piece 24c by evaporation or sputtering. Then, from these excitation electrodes, the extraction electrodes 24d and 24e are extracted to a pair of corners of the framing portion 13 across the connecting portion 9. The extraction electrode 24d of the upper side excitation electrode 24a is connected to an output terminal of the inverter 5 of FIG. 1B. The extraction electrode 24e of the lower side excitation electrode 24b is connected to an input terminal of the inverter 5 of FIG. 1B. The crystal resonator constituted with this first frame wall layer is constituted to form a crystal package as described above, and is bonded to the IC chip board with thermoset resin with solder particles to form a crystal controlled oscillator.

As described above, in the crystal controlled oscillator of Embodiment 1, the external terminal and the connecting terminal are metallically bonded by engaging solder particles dispersed in the thermoset resin with solder particles between both terminals. This electrically connects the external terminal and the connecting terminal, and both are mechanically sealed by bonding and hardening of the thermoset resin for integration at the same time.

The main part of the constitution material of (a crystal resonator part) or the entire of the crystal package of Embodiment 1 is formed by etching of a quartz-crystal material. This enables mass production of a precise crystal resonator according to a design specification at a low cost. Additionally, the crystal package can be easily downsized and low-profiled. The crystal package can be fabricated as a package only as a crystal resonator, or a downsized crystal controlled oscillator that is bonded to the IC chip board.

Additionally, the excitation electrode positioned at the upper side (the opposite side of the IC chip) of the crystal resonator (the upper side excitation electrode) is connected to an output side of the oscillator circuit, which has a low impedance. This enables the upper side excitation electrode to serve as shielding of the crystal resonator itself, and the generated voltage level becomes minute. This suppresses influence on the vibration signal due to residual electric charge generated by the external magnetic field in the crystal resonator. Thus, a stable oscillation signal is obtained.

Embodiment 2

Figure 4A:
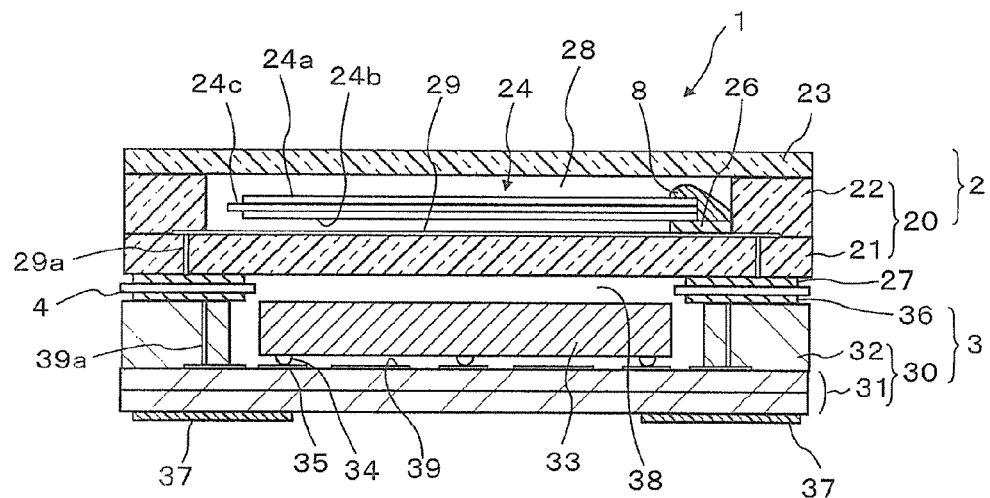
FIG. 4A and FIG. 4B are schematic views of the crystal controlled oscillator according to Embodiment 2 of the disclosure.
Figure 4B:
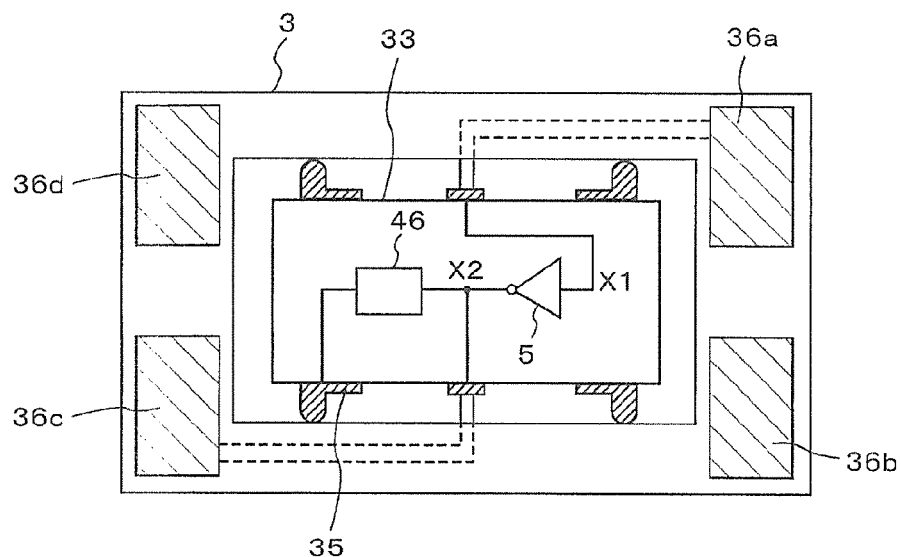

FIG. 4A and FIG. 4B are explanatory views of the crystal controlled oscillator according to Embodiment 2 of this disclosure. FIG. 4A is a cross-sectional view. FIG. 4B is a plan view of the IC chip board of FIG. 4A viewed from the crystal package side. Similarly to the above-described Embodiment 1, the crystal controlled oscillator 1 according to Embodiment 2 includes the crystal package 2 and the IC chip board 3. The crystal package 2 houses the crystal resonator 24 and is rectangular in planar view. The IC chip board 3 is a circuit component and includes the IC chip 33 that integrates an electronic circuit to constitute a crystal controlled oscillator together with the crystal package.

The crystal package 2 of the embodiment 2 includes the bottom wall layer (the first bottom wall layer) 21 of the crystal package, which is preferably to be a glass plate, the frame wall layer (the first frame wall layer) 22 of the crystal package, and the lid body 23. The crystal resonator 24 is housed in the depressed portion (the depressed portion of the crystal package, the first depressed portion) 28 surrounded by the first frame wall layer 22 of the container main body 20, which is rectangular in planar view. Usually, the crystal package 2 and the IC chip board 3 share an outer side surface in a state where the crystal package 2 and the IC chip board 3 are stacked in the vertical direction and are bonded as the crystal controlled oscillator 1.

The crystal resonator 24 includes a pair of excitation electrodes 24a and 24b on both upper and lower surfaces of a thin piece of crystal (the crystal piece) 24c. The pair of excitation electrodes 24a and 24b is formed to sandwich the crystal piece 24c by thin film formation method such as evaporation. Extraction electrodes (not shown) extending from this pair of excitation electrodes 24a and 24b to one end edge of the crystal piece are fixedly secured to a pair of crystal holding terminals 26 (only one side is shown) with a conductive adhesive 8. The pair of crystal holding terminals 26 is disposed at one side of the first depressed portion 28.

The first bottom wall layer 21 has an outer bottom surface (the other principal surface) where the external terminal 27 is disposed. The external terminal 27 connects to the connecting terminal 36 of the IC chip board 3 with the IC chip 33 via the thermoset resin with solder particles 4. The external terminal 27 electrically connects to the crystal holding terminal 26 with the through hole or the via hole 29a that passes through the first bottom wall layer 21.

The IC chip board 3 with the IC chip 33 employs a laminated substrate formed of the bottom wall layer (the second bottom wall layer) 31 of the IC chip board 3 and the frame wall layer (the second frame wall layer) 32 of the IC chip board 3 made of a ceramics sheet. A multilayer sheet may form one or the other of the second bottom wall layer 31 and the second frame wall layer 32, which constitute the IC chip board 3.

The IC chip board includes one principal surface (an IC chip mounting surface), which is the inner bottom surface of the depressed portion (the second depressed portion) 38 of the IC chip board surrounded by the second frame wall layer 32 of the IC chip board 3. A wiring pattern and a plurality of electrode pads 35 are formed on the one principal surface. The connecting terminal 36 to be connected to the external terminal 27 of the crystal package 2 are formed on the opening end surface of the second frame wall layer 32. The IC chip board 3 includes the other principal surface (the outer bottom surface of the second bottom wall layer 31, target equipment mounting surface) where a plurality of mounting terminals 37 (four in this example) are disposed for surface mounting to apply to a circuit board of the electronic equipment.

The IC chip 33 is fixedly secured to the electrode pad 35 on one principal surface (an inner bottom surface) of the second frame wall layer 32 via its mounting bump 34 (such as a solder bump or gold bump) by ultrasonic thermo-compression bonding or similar method. FIG. 4B is a plan view when the IC chip board 3 is viewed from the side of the crystal package 2. The IC chip 33 is mounted in the second depressed portion 38.

FIG. 4B schematically illustrates the main part of the crystal oscillator circuit in the IC chip 33 especially related to this disclosure. That is, among the oscillator circuits illustrated in above-described FIG. 13 and FIG. 14, the inverting amplifier 5 and the output buffer circuit 46 are selected for illustration.

A second container is formed by the second bottom wall layer 31 and the second frame wall layer 32 that constitute the IC chip board 3. In the second container, the connecting terminal 36 (36a, 36b, 36c, 36d) are disposed on the opening end surface (the surface of the second frame wall layer 32 facing the external terminal 27 of the crystal package 2) of the second depressed portion 38. The connecting terminal 36 faces and electrically connects to the external terminal 27 of the crystal package 2. The connecting terminal 36 (36a, 36b, 36c, 36d) connects to a predetermined circuit terminal of the IC chip 33 via the through hole or the via hole, which is appropriately disposed at the second container, and a wiring (not shown), which is patterned on the inner bottom surface of the second bottom wall layer 31 that constitutes the second depressed portion 38.

Among the connecting terminals 36 (36a, 36b, 36c, 36d), the connecting terminal 36a connects to the lower side excitation electrode 24b (the side facing the IC chip 33) of the crystal resonator 24, and the connecting terminal 36c is connected to the upper side excitation electrode 24a (the opposite side of the IC chip 33) of the crystal resonator 24.

Vibration signals of the crystal resonator 24 of the crystal package 2 are connected to an input side (X1) and an output side (X2) of an oscillator circuit integrated to the IC chip 33 mounted to the IC chip board 3 through the external terminal 27 and the connecting terminal 36. At this time, the excitation electrode (the upper side excitation electrode) 24a positioned at the upper side of the crystal resonator (the opposite side of the IC chip) is connected to an output side (X2), which has a low impedance. The lower side excitation electrode 24b is connected to an input side (X1), which is a high impedance side.

This enables the upper side excitation electrode 24a to serve as electromagnetic shielding of the crystal resonator 24. An electric charge generated by an external magnetic field, which acts on the upper side excitation electrode, is grounded from the output terminal of the oscillator circuit that is a low impedance side of the oscillator circuit. This reduces the generated voltage level minute. This prevents the accumulation of an electric charge that remains in the crystal resonator and affects the vibration signal.

FIG. 5A to FIG. 5C are schematic views further illustrating the constitution of the IC chip board illustrated in FIG. 4B. FIG. 5A is a plan view illustrating a portion of the second depressed portion of the IC chip board 3 viewed from the crystal package 2 side of FIG. 4A. FIG. 5B is a side view of a long side of the IC chip board 3, and FIG. 5C is a side surface of the short side of the IC chip board 3. FIG. 5A to FIG. 5C illustrate a state before the IC chip illustrated in FIG. 4B is mounted. A pad 35 and a required wiring 35a are formed at the inner bottom surface of the second depressed portion 38. The pad 35 connects a bump 34 of the IC chip.

FIG. 6 is an outer bottom view of the IC chip board illustrated in FIG. 5A to FIG. 5C. The IC chip board 3 includes a plurality of (four in FIG. 6) mounting terminals 37 for surface mounting (37a, 37b, 37c, 37d) on the outer bottom surface. The mounting terminal 37a corresponds to an input terminal T1 of a supply voltage (VCC). The mounting terminal 37b corresponds to an automatic frequency control (AFC) voltage input terminal T2. The mounting terminal 37c corresponds to a grounding (GND) terminal T3. The mounting terminal 37d corresponds to an oscillation output (OUT) terminal T4. Each terminal is connected to a wiring pattern with the through hole or a via hole 39a.

FIG. 7A to FIG. 7C are schematic views illustrating one constitution of the crystal resonator 24 housed in the crystal package of the crystal controlled oscillator according to this disclosure. FIG. 7A is a plan view of the crystal resonator 24 illustrated in FIG. 4A viewed from the lid body 23 side. FIG. 7B is a cross-sectional view taken along the line XIIB-XIIB of FIG. 7A. Similarly, FIG. 7C is a cross-sectional view taken along the line XIIC-XIIC of FIG. 7A. The crystal resonator 24 includes the respective excitation electrodes 24a and 24b on both front and back surfaces of the planar crystal piece 24c by a method such as evaporation. These excitation electrodes 24a and 24b are formed at the central region of the crystal piece 24c leaving the peripheral edge of the crystal piece 24c. The extraction electrodes 24d and 24e are formed at one short side of the crystal piece 24c from the respective excitation electrodes 24a and 24b. The respective end portions are formed to a part of the surface on the opposite side wrapping the end edge of the crystal piece. Such constitution of the end portion of extraction electrode ensures electrical connection to the crystal holding terminal 26 with the conductive adhesive 8.

FIG. 8A to FIG. 8C are trihedral views illustrating the crystal piece of another shape employed for the crystal resonator of the crystal controlled oscillator according to the disclosure. FIG. 8A is a plan view, FIG. 8B is a side view of long side of the crystal piece, and FIG. 8C is a side view of the short side of the crystal piece. The crystal resonator illustrated in the above-described FIG. 7A to FIG. 7C includes the planar crystal piece where the excitation electrode has been formed by a method such as evaporation. The crystal piece 24c illustrated in FIG. 8A to FIG. 8C has an incline to the peripheral edge to confine most of the vibration energy to the central region. The excitation electrode is formed to the shape similar to the above-described FIG. 7A to FIG. 7C. Employing this crystal piece can obtain crystal vibration efficiently.

According to Embodiment 2, the external terminal and the connecting terminal are metallically bonded by engaging solder particles dispersed in the thermoset resin with solder particles between both terminals. This electrically connects the external terminal and the connecting terminal, and both are mechanically sealed by bonding and hardening of the thermoset resin for integration at the same time.

Additionally, the excitation electrode positioned at the upper side (the opposite side of the IC chip) of the crystal resonator (the upper side excitation electrode) is connected to an output side of the oscillator circuit, which has a low impedance. This enables the upper side excitation electrode to serve as shielding of the crystal resonator itself, and the generated voltage level becomes minute. This suppresses influence on the vibration signal due to residual electric charge generated by the external magnetic field in the crystal resonator. Thus, a stable oscillation signal is obtained.

Embodiment 3

Figure 9A:
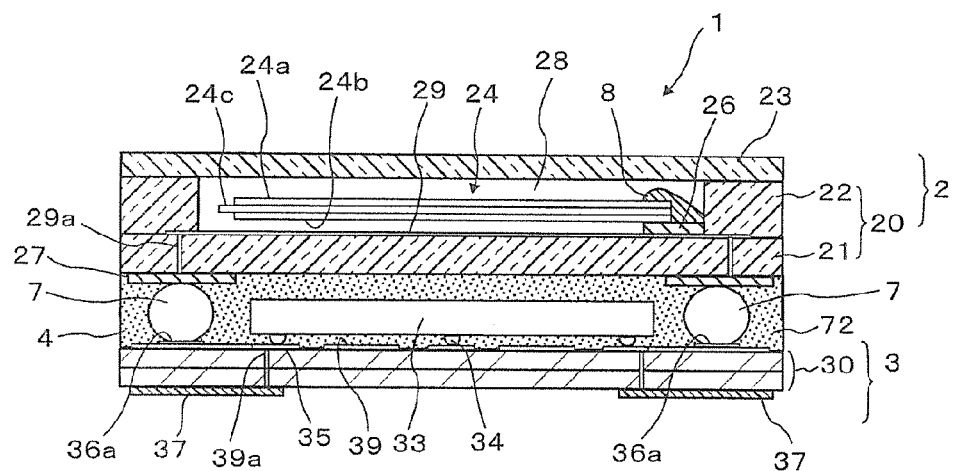
FIG. 9A and FIG. 9B are explanatory views of the crystal controlled oscillator according to Embodiment 3 of the disclosure.
Figure 9B:
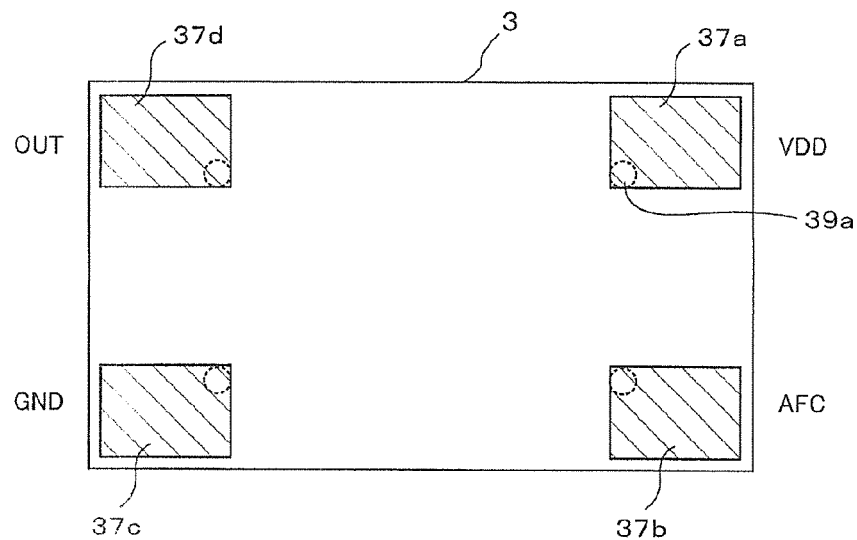

FIG. 9A and FIG. 9B are explanatory views of the crystal controlled oscillator of Embodiment 3 according to this disclosure. FIG. 9A is a cross-sectional view. FIG. 9B illustrates a plan view of the outer bottom surface of the IC chip board of FIG. 9A. The crystal controlled oscillator 1 according to Embodiment 3, similar to one illustrated in FIG. 4A, includes the crystal package 2 and the IC chip board 3. The crystal package 2 houses the crystal resonator 24 and is rectangular in planar view. The IC chip board 3 is a circuit component and includes the IC chip 33 that integrates an electronic circuit to constitute the crystal controlled oscillator together with the crystal package.

The crystal package 2 includes the bottom wall layer (the first bottom wall layer) 21 of the crystal package, which is preferably to be a glass plate, the frame wall layer (the first frame wall layer) 22 of the crystal package, and the lid body 23. The crystal resonator 24 is housed in the depressed portion (the depressed portion of the crystal package, the first depressed portion) 28 surrounded by the first frame wall layer 22 of the container main body 20, which is rectangular in planar view. The detailed constitution is the same as the constitution of Embodiment 1, and therefore the repeated explanation is omitted. Embodiment 2 differs from Embodiment 1 in the constitution of the IC chip board 3 and the structure of bonding this IC chip board 3 to the crystal package.

The IC chip board 3 includes the electrode pad 35 where the IC chip 33 is to be mounted, and a required wiring pattern 39 on the principal surface (the surface facing the crystal package) of a substrate 30 formed by a ceramics sheet. Additionally, a connecting terminal 36a, which is connected to the wiring pattern 39, is disposed on the IC chip board 3 at the position facing the external terminal 27 of the above-described crystal package. The IC chip 33 is mounted to the principal surface of the IC chip board 3 similarly to the above-described Embodiment 1.

The following describes one exemplary process where the crystal package is bonded to this IC chip board 3. That is, the thermoset resin with solder particles 4 is applied surrounding the surface where the connecting terminal 36a of the IC chip board 3 is formed. Then, a metal ball 7 is disposed between the connecting terminal 36a of the IC chip board 3 and the external terminal 27 of the crystal package 2. The metal ball 7 defines a bonding distance between both of them. The metal ball 7 is a member that defines the bonding distance between the external terminal 27 and the connecting terminal 36a and electrically connects both of em. As this metal ball 7, nickel, gold, copper, solder, and other good electrical conductors are applicable. In this embodiment, a solder ball that is made of a solder material and has a melting temperature higher than that of solder particles of the thermoset resin with solder particles 4 is employed.

It is preferred that the thermoset resin with solder particles 4 be applied to fill the top surface and the side surface of the IC chip 33. The thermoset resin with solder particles 4 is applied, the metal ball 7 is supplied to a predetermined position, and heating and pressurization processes are performed. The crystal package 2 and the IC chip board 3 are heated and pressurized. The solder particles in the thermoset resin with solder particles 4 are engaged between the metal ball 7 and the connecting terminal 36a, and between the metal ball 7 and the external terminal 27 for metal bonding. Thus, the connecting terminal 36a and the external terminal 27 are electrically connected. This further strongly and fixedly secures the crystal package 2 and the IC chip board 3. Additionally, a space does not remain between the crystal package 2 and the IC chip board 3. This prevents adhesion of dust to the IC chip 33, allowing isolation of the IC chip from the outside environment.

The IC chip board 3 includes a plurality of (four in FIG. 9B) mounting terminals 37 (37a, 37b, 37c, 37d) for surface mounting on the outer bottom surface, similar to mounting terminals illustrated in FIG. 6.

Additionally, similarly to Embodiment 2, with Embodiment 3, the excitation electrode (the upper side excitation electrode) positioned at the upper side (the opposite side of the IC chip) of the crystal resonator is connected to an output side of the oscillator circuit, which has a low impedance. This enables the upper side excitation electrode to serve as shielding of the crystal resonator itself, and the generated voltage level becomes minute. This suppresses influence on the vibration signal due to residual electric charge generated by the external magnetic field in the crystal resonator. Thus, a stable oscillation signal is obtained.

Embodiment 4

Figure 10A:
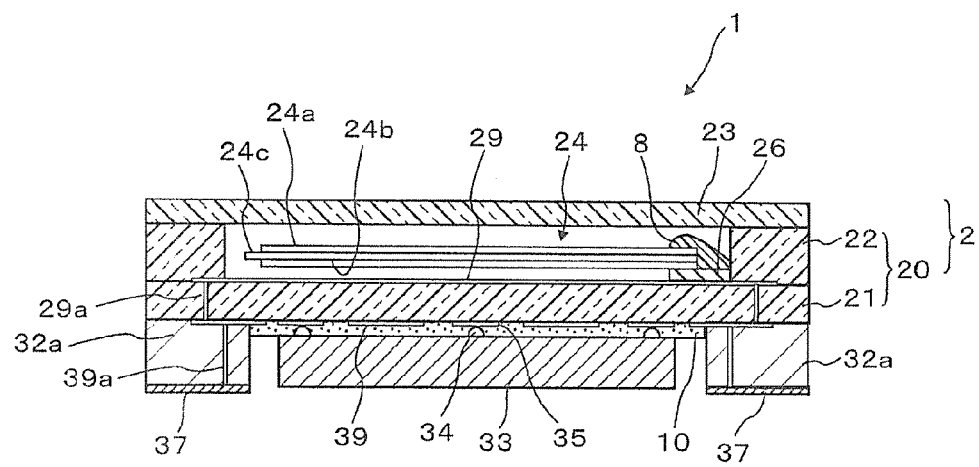
FIG. 10A and FIG. 10B are explanatory views of the crystal controlled oscillator according to Embodiment 4 of the disclosure.
Figure 10B:
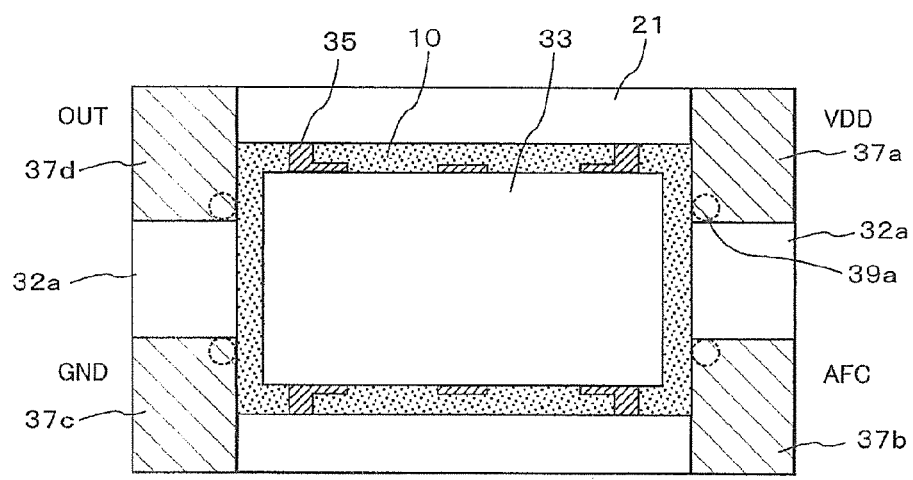

FIG. 10A and FIG. 10B are explanatory views of the crystal controlled oscillator of Embodiment 4 according to this disclosure. FIG. 10A is a cross-sectional view. FIG. 10B illustrates a plan view of the outer bottom surface of the crystal package with the IC chip 33 of FIG. 10A. The crystal controlled oscillator 1 according to Embodiment 4, similar to one illustrated in FIG. 4A and FIG. 9A, includes the crystal package 2 and the IC chip 33. The crystal package 2 houses the crystal resonator 24 and is rectangular in planar view. The IC chip 33 integrates an electronic circuit to constitute the crystal controlled oscillator together with the crystal package.

The crystal package 2 includes the bottom wall layer (the first bottom wall layer) 21 of the crystal package, which is preferably to be a glass plate, the frame wall layer (the first frame wall layer) 22 of the crystal package, and the lid body 23. The crystal resonator 24 is housed in the depressed portion (the depressed portion of the crystal package, the first depressed portion) 28 surrounded by the first frame wall layer 22 of the container main body 20, which is rectangular in planar view. The detailed constitution is the same as the constitution of Embodiment 1, and therefore the repeated explanation is omitted. Embodiment 4 differs from Embodiment 1 and Embodiment 2 in the mounting structure of the IC chip 33. The bottom wall layer 21 includes the pad 35 to mount the IC chip 33 and the required wiring pattern 39 on the outer bottom surface. Respective bank-like portions 32a are disposed on both ends of short sides of this outer bottom surface. The mounting terminals 37 (37a, 37b, 37c, 37d) for surface mounting are disposed on end surfaces of these bank-like portions 32a (on the surface opposite to the crystal package).

In Embodiment 4, resin (such as thermosetting epoxy resin), which serves as underfill, is filled between the bottom wall layer 21 constituting the crystal package and the bottom surface of the IC chip 33 (the bottom wall layer 21 side). The bump 34 is connected to the pad 35 formed at the outer bottom surface of the bottom wall layer 21 constituting the crystal package at inside of the bank-like portions 32a at both sides by ultrasonic thermo-compression bonding or similar method, thus mounting the IC chip 33. Then, a heating process is performed to act on the resi thus an underfill 10 is formed. Note that resin for underfill is applied covering the entire IC chip 33 to process so-called molding at a mounting portion of the IC chip 33.

With Embodiment 4 as well, the excitation electrode (the upper side excitation electrode) positioned at the upper side (the opposite side of the IC chip) of the crystal resonator is connected to an output side of the oscillator circuit, which has a low impedance. This enables the upper side excitation electrode to serve as shielding of the crystal resonator itself, and the generated voltage level becomes minute. This suppresses influence on the vibration signal due to residual electric charge generated by the external magnetic field in the crystal resonator. Thus, a stable oscillation signal is obtained.

Embodiment 5

Figure 11:
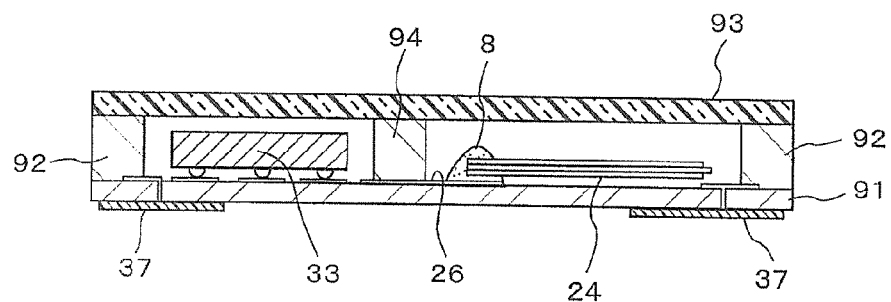
FIG. 11 is an explanatory view of the crystal controlled oscillator according to Embodiment 5 of the disclosure.
Figure 12:
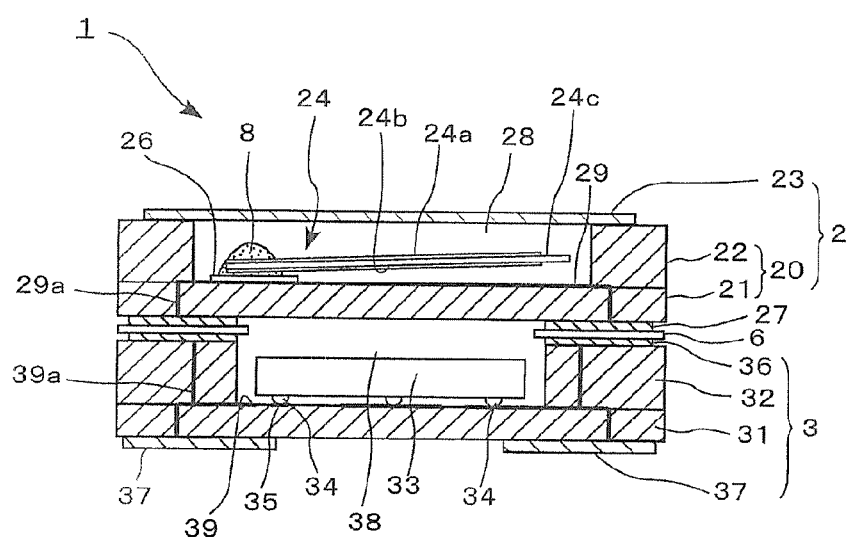
FIG. 12 is a schematic view illustrating one exemplary constitution of a conventional crystal controlled oscillator.

FIG. 11 is an explanatory view of the crystal controlled oscillator of Embodiment 5 according to this disclosure. In Embodiment 5, the crystal package and the IC chip are disposed on the same surface of a common substrate to achieve a low-profile crystal package to the maximum extent possible. In FIG. 11, the container of this crystal controlled oscillator is constituted of a substrate 91 and a lid body 93. The substrate 91 is made of a ceramics sheet. An outer periphery sidewall 92, which is similarly made of a ceramics sheet, is disposed surrounding a peripheral end portion of the substrate 91.

In the illustrated exemplary configuration, a depressed portion that houses the crystal resonator 24 and a depressed portion that mounts the IC chip are disposed on the substrate 91. These two depressed portions are divided by a divider wall 94, which is not essential. Since the lid body 93 is made of a glass plate, this divider wall 94 is disposed to prevent the lid body from curving and to reinforce the lid body depending on the size of the crystal controlled oscillator. A method same as one described in any of the above-described embodiments is employed for fixedly securing the crystal resonator 24 and mounting the IC chip 33. The substrate 91, the sidewall 92, and the divider wall 94 can be formed by a glass material similar to the lid body 93. In that case, both are bonded with a fritted glass.

With Embodiment 5 as well, the excitation electrode (the upper side excitation electrode) positioned at the upper side (the opposite side of the mounting bump of the IC chip) of the crystal resonator is connected to an output side of the oscillator circuit, which has a low impedance. This enables the upper side excitation electrode to serve as shielding of the crystal resonator itself, and the generated voltage level becomes minute. This suppresses influence on the vibration signal due to residual electric charge generated by the external magnetic field in the crystal resonator. Thus, a stable oscillation signal is obtained.

The crystal controlled oscillator is described above as if it were individually fabricated. However, this disclosure is similarly applicable to the crystal controlled oscillator fabricated by the following method. A plurality of devices is formed on a large-size glass plate or a ceramics sheet for both the crystal package and the IC chip board. The glass plate becomes a base material of a plurality of crystal controlled oscillators. The crystal package side and the IC substrate side are bonded and then individually separated.

This disclosure is not limited to a crystal controlled oscillator but is similarly applicable to bonding of two or more device components. In the bonding, a vibration generating element using a piezoelectric material, a filter, or similar member and an IC chip that constitutes a circuit of the oscillator circuit or similar are electrically connected. Additionally, it is applicable to bonding where airtightness and strong mechanical bonding are required.

Additionally, only the above-described crystal package may be employed as an independent electronic component. Especially, for electronic equipment where a low-profile is the first purpose, or electronic equipment or similar equipment with a mounting method related to other electronic components different from the above-described IC chip boards, a crystal package may be employed alone.

A crystal controlled oscillator according to this disclosure includes a crystal package with an insulating container that houses a crystal resonator and an IC chip board that includes an IC chip integrating a circuit to constitute a crystal controlled oscillator circuit. The crystal package includes an external terminal and is formed by a glass material or a plate of a quartz-crystal material (hereinafter referred to as a glass material or similar). The IC chip board includes a container that includes a connecting terminal connecting to the above-described external terminal. The crystal package and the IC chip board are electrically, mechanically, and strongly bonded together. The crystal controlled oscillator has shielding effect to a crystal piece without disposing another member such as the conventional lid body made of metal. A description will be given of a representative configuration.

In one exemplary configuration of a crystal package employed for this disclosure, the crystal package is configured as follows. A crystal plate is etched. A crystal piece, which constitutes a crystal resonator, is integrally formed at a central portion surrounded by a framing portion. An excitation electrode is formed at the crystal piece to make a crystal resonator. Then, this product is sandwiched with a bottom wall layer and a lid body made of a material such as a glass material preferably to be a quartz-crystal material.

In another configuration of the crystal package employed for this disclosure, the crystal package is configured as follows. The crystal package includes a container that houses a crystal resonator at a depressed portion. The depressed portion is formed by a bottom wall layer and a frame wall layer made of a glass plate or similar. The depressed portion is sealed by a lid body similarly made of a glass plate or similar material.

Any above-described crystal package includes an external terminal on an outer bottom surface of the bottom wall layer. The external terminal electrically connects to an IC chip board described below. The external terminal connects to an excitation electrode of the crystal resonator.

An IC chip board includes a container that includes the depressed portion. The depressed portion is formed by a bottom wall layer and a frame wall layer made of a ceramics sheet and mounts the IC chip. It is obvious that the IC chip board may be formed of another insulating material such as a glass plate similar to the crystal package.

A connecting terminal is disposed at an opening end surface (a surface of the frame wall layer) of the depressed portion of the container. The container is formed by the bottom wall layer and the frame wall layer constituting the IC chip board. The connecting terminal faces the external terminal of the crystal package and electrically connects to the external terminal. The connecting terminal connects to an IC chip circuit. The bottom wall layer includes a mounting terminal on the outer bottom surface. The mounting terminal is for surface mounting on a printed board or similar of the mounting target equipment. An operating power source is supplied from these terminals, and an oscillation signal is supplied to a required functional circuit of a mounting board.

The crystal package and the IC chip board are connected by heating and pressurizing the thermoset resin with solder particles interposed between the formation surface of the external terminal and the formation surface of the connecting terminal. The thermoset resin with solder particles, where solder particles are dispersed in the thermoset resin, is applied by surrounding the whole surface including the connecting terminal on the opening end surface of the depressed portion of the IC chip board (the surface facing the outer bottom surface of the crystal package). Heating and pressurization of this thermoset resin with solder particles electrically connects the above-described external terminal and connecting terminal. Additionally, the crystal package and the IC chip board are mechanically and strongly sealed to shut off air and fixedly secured. The thermoset resin with solder particles may be applied on the outer bottom surface side of the crystal package, or may be applied on both the opening end surface of the depressed portion of the IC chip board and the outer bottom surface of the crystal package.

In the thermoset resin with solder particles, tiny solder particles are dispersed into thermoset resin such as epoxy resin, acrylic resin, and phenol resin. When members to be connected, which include electrodes to be connected, are connected to each other with the thermoset resin with solder particles, metal bonding is performed by heating and pressurization where the electrodes are fixedly secured by engaging the solder particles. Then, melting and hardening of the resin bonds the members to be connected including between the electrodes.

In this disclosure, the external terminal of the crystal resonator and the connecting terminal of the IC chip board are electrically and mechanically bonded as follows. Tiny solder particles dispersed in the thermoset resin with solder particles are engaged between both terminals and both are metallically bonded. In the case where both surfaces that face each other have no external terminal and no connecting terminal hardening of the heated thermoset resin and hardening according to the subsequent temperature decrease mechanically and strongly seals the crystal package and the IC chip board, and the crystal package and the IC chip board are fixedly secured.

A vibration signal input and a vibration signal output of the crystal resonator constituting the crystal package are connected to an input side and an output side of the oscillator circuit integrated to the IC chip mounted to the IC chip board through the external terminal and the connecting terminal, respectively. The excitation electrode (the upper side excitation electrode) positioned at the upper side of the crystal resonator (the opposite side of the IC chip) is connected to an output side that has a low impedance. An electric charge generated by an external magnetic field, which acts on the upper side excitation electrode, is grounded from an output terminal side of the oscillator circuit that has a low impedance to the oscillator circuit at the grounding side. This reduces the generated voltage to a minute level. This suppresses the influence (generation of noise) on the vibration signal due to residual electric charge generated by the external magnetic field in the crystal resonator.

It will be obvious that various modifications are possible without departing from the technical scope of the appended claims. This disclosure can be embodied and practiced in other different forms without departing from the spirit and essential characteristics of the disclosure.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. A crystal controlled oscillator, comprising:
a crystal package with an insulating container that houses a crystal resonator; and
an IC chip board that includes an IC chip integrating an oscillator circuit, the oscillator circuit being configured to generate an oscillation signal of a predetermined frequency based on a vibration signal of the crystal resonator, wherein
the crystal package includes:
a first container that includes a planar first bottom wall layer made of an insulating material and a first frame wall layer disposed at an end edge of the first bottom wall layer, the first frame wall layer forming a first depressed portion;
a crystal resonator housed in the first depressed portion along an inner surface of the first bottom wall layer;
a lid body secured to the first frame wall layer so as to hermetically seal the first depressed portion, the lid body being made of an insulating material only; and
an external terminal at an outer bottom surface of the first bottom wall layer of the first container, the external terminal being configured to output a vibration signal of the crystal resonator, wherein
the crystal resonator includes a crystal piece, an upper side excitation electrode on an upper surface of the crystal piece, and a lower side excitation electrode on a lower surface of the crystal piece, and
the IC chip integrates an oscillator circuit disposed at an outer bottom surface of the first bottom wall layer of the crystal package, the oscillator circuit connecting to the lower side excitation electrode of the crystal resonator from the external terminal to an input side with high impedance, the oscillator circuit connecting to the upper side excitation electrode to an output side with low impedance, the upper side excitation electrode being a shielding electrode of the crystal resonator.

2. The crystal controlled oscillator according to claim 1, wherein
the crystal package includes:
a crystal piece that includes a framing body formed by processing of a crystal plate and a connecting portion, the crystal piece being connected to an inner wall of the framing body;
a crystal package frame wall layer that includes the upper side excitation electrode and the lower side excitation electrode on front and back of the crystal piece, and an extraction electrode extracted from the respective upper side excitation electrode and the lower side excitation electrode across the connecting portion along the front and back of the framing portion;
a crystal package bottom wall layer made of an insulating material, the crystal package bottom wall layer being bonded to the IC chip board side of the crystal package frame layer; and a lid body made of an insulating material, the lid body being bonded on a surface at an opposite side of the IC chip board of the crystal package.

3. The crystal controlled oscillator according to claim 2, wherein
   a bottom wall layer and the lid body of the crystal package is made of an insulating material, and
   the insulating material is a quartz-crystal material.

4. The crystal controlled oscillator according to claim 1, wherein
   the IC chip board includes a planar second bottom layer made of an insulating material and a second frame wall layer to form a second container, the second frame wall layer being disposed at an end edge of the second bottom wall layer, the second frame wall layer forming a second depressed portion, the IC chip being mounted at the second depressed portion along an inner surface of the second bottom wall layer, wherein
   the crystal controlled oscillator further includes:
      a connecting terminal that electrically connects to the external terminal, the connecting terminal being disposed at an opening end surface of the second frame wall layer constituting the second depressed portion of the second container; and
      a mounting terminal for flat surface mounting to a mounting equipment at an outer bottom surface of the second container, wherein
   the external terminal of the crystal package and the connecting terminal of the IC chip board are electrically connected by a metal bonding, the metal bonding engaging solder particles dispersed in thermoset resin with solder particles.

5. The crystal controlled oscillator according to claim 4, wherein
   the thermoset resin with solder particles seals and bonds the outer bottom surface of the first container of the crystal package and an opening end surface of the second frame wall layer of the second container constituted by the IC chip board, the bonding portion being an entire region including the external terminal and the connecting terminal.

6. The crystal controlled oscillator according to claim 1, wherein
   the IC chip board has a principal surface where the IC chip is mounted, and includes a connecting terminal on the principle surface where the IC chip is mounted, the connecting terminal being at a position facing the external terminal of the crystal package,
   the thermosetting resin with solder particles and a metal ball are disposed between the external terminal and the connecting terminal that defines a distance between the crystal package and the IC chip board, the thermosetting resin with solder particles and the metal ball electrically connecting the external terminal and the connecting terminal, and
   the crystal package and the IC chip board are sealed and fixedly secured with the thermoset resin with solder particles.

7. The crystal controlled oscillator according to claim 6, wherein
   the thermoset resin with solder particles are filled between the crystal package and the IC chip board so as to cover the IC chip.

8. The crystal controlled oscillator according to claim 1, wherein
   the outer bottom wall constitutes the first container of the crystal package, a pad electrode and a wiring pattern are formed at the outer bottom wall, and
   the IC chip includes a bump connected to the pad electrode.

9. The crystal controlled oscillator according to claim 8, wherein
   the outer bottom wall and the IC chip constitute the first container of the crystal package, a resin being filled between the outer bottom wall and the IC chip so as to strongly secure the IC chip.

\* \* \* \* \*